US009070442B2

(12) United States Patent
Yip et al.

(10) Patent No.: US 9,070,442 B2
(45) Date of Patent: Jun. 30, 2015

(54) MEMORY DEVICES WITH LOCAL AND GLOBAL DEVICES AT SUBSTANTIALLY THE SAME LEVEL ABOVE STACKED TIERS OF MEMORY CELLS AND METHODS

(71) Applicant: Micron Technology, Inc., Boise, ID (US)

(72) Inventors: Aaron S. Yip, Los Gatos, CA (US); Mark A. Helm, Santa Cruz, CA (US); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 117 days.

(21) Appl. No.: 14/013,370

(22) Filed: Aug. 29, 2013

(65) Prior Publication Data

US 2015/0063024 A1    Mar. 5, 2015

(51) Int. Cl.
| G11C 16/00 | (2006.01) |
| G11C 16/02 | (2006.01) |
| G11C 11/063 | (2006.01) |
| G11C 11/06 | (2006.01) |
| G11C 5/02 | (2006.01) |

(52) U.S. Cl.
CPC ............. *G11C 16/02* (2013.01); *G11C 11/063* (2013.01); *G11C 11/06064* (2013.01); *G11C 5/025* (2013.01); *G11C 11/06035* (2013.01)

(58) Field of Classification Search
CPC ............ G11C 16/02; G11C 11/06035; G11C 11/06064; G11C 11/063; G11C 11/06042; G11C 11/06078; G11C 16/08; G11C 5/025
USPC .................. 365/185.05, 51, 63, 130, 230.03, 365/230.06
See application file for complete search history.

(56) References Cited

U.S. PATENT DOCUMENTS

| 8,411,477 | B2 * | 4/2013 | Tang et al. ....................... 365/51 |
| 8,446,767 | B2 * | 5/2013 | Tang et al. ............... 365/185.17 |
| 8,593,869 | B2 * | 11/2013 | Tanzawa ................... 365/185.17 |
| 8,912,589 | B2 * | 12/2014 | Wang ............................. 257/324 |
| 8,923,057 | B2 * | 12/2014 | Son et al. .................. 365/185.17 |
| 2010/0097858 | A1 | 4/2010 | Tokiwa et al. |
| 2013/0242654 | A1 * | 9/2013 | Sim et al. .................. 365/185.05 |
| 2013/0258779 | A1 * | 10/2013 | Liu ............................ 365/185.11 |
| 2013/0294168 | A1 * | 11/2013 | Shirakawa ............... 365/185.17 |

* cited by examiner

*Primary Examiner* — Tan T. Nguyen
(74) *Attorney, Agent, or Firm* — Dicke, Billig & Czaja, PLLC

(57) ABSTRACT

In an embodiment, a memory device includes a stack of tiers of memory cells, a tier of local devices at a level above the stack of tiers of memory cells, and a tier of global devices at substantially a same level as the tier of local devices. A local device may provide selective access to a data line. A global device may provide selective access to a global access line. A tier of memory cells may be selectively coupled to a global access line by the global device of the tier of global devices.

42 Claims, 8 Drawing Sheets

US 9,070,442 B2

MEMORY DEVICES WITH LOCAL AND GLOBAL DEVICES AT SUBSTANTIALLY THE SAME LEVEL ABOVE STACKED TIERS OF MEMORY CELLS AND METHODS

FIELD

The present disclosure relates generally to, memory devices and, in particular, the present disclosure relates to memory devices with local and global devices at substantially the same level above stacked tiers of memory cells and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select transistors, e.g., a source select transistor and a drain select transistor. Each source select transistor is connected to a source line, while each drain select transistor is connected to a data line, such as column bit line. A "column" refers to a group of memory cells that are commonly coupled to a local data line, such as a local bit line. It does not require any particular orientation or linear relationship, but instead refers to the logical relationship between memory cell and data line.

To meet the demand for higher capacity memories, designers continue to strive for increasing memory density, i.e., the number of memory cells in a given area of an integrated circuit die. One way to increase the density of memory devices is to form stacked memory arrays, e.g., often referred to as three-dimensional memory arrays.

For example, the memory cells at a common location (e.g., at a common vertical level) in a stacked memory array may form a tier of memory cells. The memory cells in each tier might be coupled to one or more access lines, such as local access lines (e.g., local word lines), that are in turn selectively coupled to drivers by transistors, such as pass transistors. For example, routing circuitry might couple the local access lines to the pass transistors, and voltage supply circuitry, such as global access lines (e.g., global word lines), might couple the pass transistors to access-line drivers. However, as the number of tiers, and thus the number of local access lines, increases so does the number of pass transistors and/or the amount of routing circuitry and/or the number of global access lines. This can lead to increases in the size of the memory device.

For the reasons stated above, and for other reasons stated below which will become apparent to those skilled in the art upon reading and understanding the present specification, there is a need in the art for alternatives to existing pass transistor and/or routing circuitry configurations in memory devices with stacked memory arrays.

DETAILED DESCRIPTION

Figure 1:
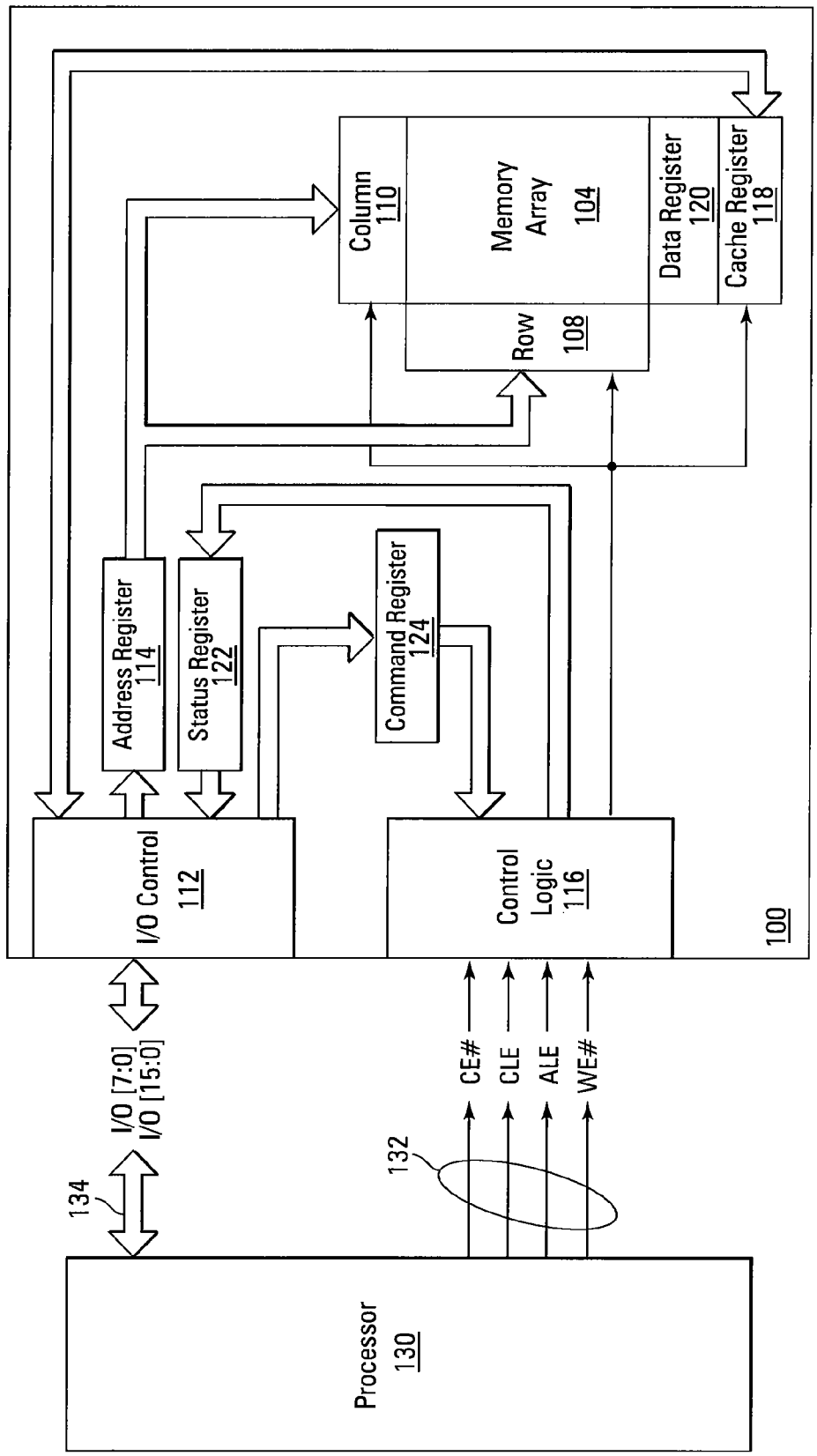
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

Stacked (e.g., three-dimensional) memory arrays might include a plurality of stacked quasi-two-dimensional arrays. An array may be considered to be quasi-two dimensional when the memory cells are formed in substantially a single plane, such as a substantially horizontal plane, for example. Some stacked memory arrays might include pillars of stacked memory elements, such as vertical series-coupled strings of memory cells, e.g., NAND strings. For example, a pillar might be a semiconductor and a plurality of memory cells (e.g., a series-coupled string of memory cells) might be adjacent to the pillar. The use of the term "substantially" herein accounts for routine variations such as routine process variations. The term "vertical" may be defined, for example, as a direction that is perpendicular to a base structure, such as a surface of an integrated circuit die, and "substantially vertical" accounts for variations from vertical, e.g., due to routine process variations.

The memory cells at a common location (e.g., at a common vertical level) in a stacked memory array may form a tier of memory cells. For example, each of the stacked quasi-two-dimensional arrays may form a tier of memory cells. For example, the memory cells at a common vertical location (e.g., elevation) in the vertical strings of series-coupled memory cells may form a tier of memory cells. The memory cells in each tier might be coupled to a plurality of local access lines (e.g., local word lines) that are in turn selectively coupled to an access-line driver (e.g., a word-line driver) using pass transistors. For example, routing circuitry might couple the local access lines to the pass transistors, and global access lines might couple the pass transistors to access-line drivers.

In an effort to reduce the number of pass transistors and/or the amount and/or complexity of routing circuitry and global access lines, the local access lines in each tier might be shorted together. For example, the memory cells in each tier might be commonly coupled to an assess-line (e.g., word-line) plate, such as an access plate. The access plate, and thus the commonly-coupled memory cells in each tier, may be selectively coupled to an access-line driver by a pass transistor. For example, routing circuitry might couple an access plate to a pass transistor, and a global access line might couple the pass transistor to an access-line driver. However, as the number of tiers increase, the resulting increase in the number of pass transistors, the number of global access lines, and/or the amount routing circuitry can still result in increased memory device size.

For example, pass transistors are sometimes located under a stacked memory array. However, as the number of pass transistors increases, this arrangement can become undesirable, in that the memory device might need to increase in size to accommodate the pass transistors and other critical circuitry that might need to be located under the memory array.

FIG. 1 is a simplified block diagram of an electronic device, e.g., an integrated circuit device, such memory device 100, in communication with a processor 130 as part of an electronic system, according to an embodiment. Memory device 100 might be a NAND flash memory device, for example. The processor 130 may be a memory controller or other external host device.

Memory device 100 includes an array of memory cells 104. A row decoder 108 and a column decoder 110 might be provided to decode address signals. Address signals are received and decoded to access memory array 104.

Memory device 100 might be formed and configured according to the present disclosure. For example, memory device 100 might include a stack of tiers of memory cells. A tier of local devices might be at a level above the stack of tiers of memory cells. A tier of global devices might be at substantially a same level as the tier of local devices. Each local device may provide selective access to a data line. Each global device may provide selective access to a corresponding global access line. Each tier of memory cells may be selectively coupled to one or more global access lines by one or more of the global devices of the tier of global devices. For some embodiments, the tier of local devices and the tier of global devices might be formed substantially concurrently.

For some embodiments, memory device 100 might include a plurality of stacked memory cells respectively at different vertical levels. A select transistor might be above the plurality of stacked memory cells and might selectively couple the plurality of memory cells to a data line. A plurality of pass transistors might be at substantially the same vertical level as the select transistor. Each of the pass transistors might selectively couple a control gate of corresponding one of the memory cells to a corresponding global access line. The select transistor and the plurality of pass transistors might be formed substantially concurrently, for some embodiments.

Memory device 100 may also include input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and a controller, e.g., that may include control logic 116, to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

A controller can include control logic, such as control logic 116, other circuitry, firmware, software, or the like, whether alone or in combination, and can be an external controller, such as processor 130, (e.g., in a separate die from the memory array, whether wholly or in part) or an internal controller, such as a controller including control logic 116 (e.g., included in a same die as the memory array).

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
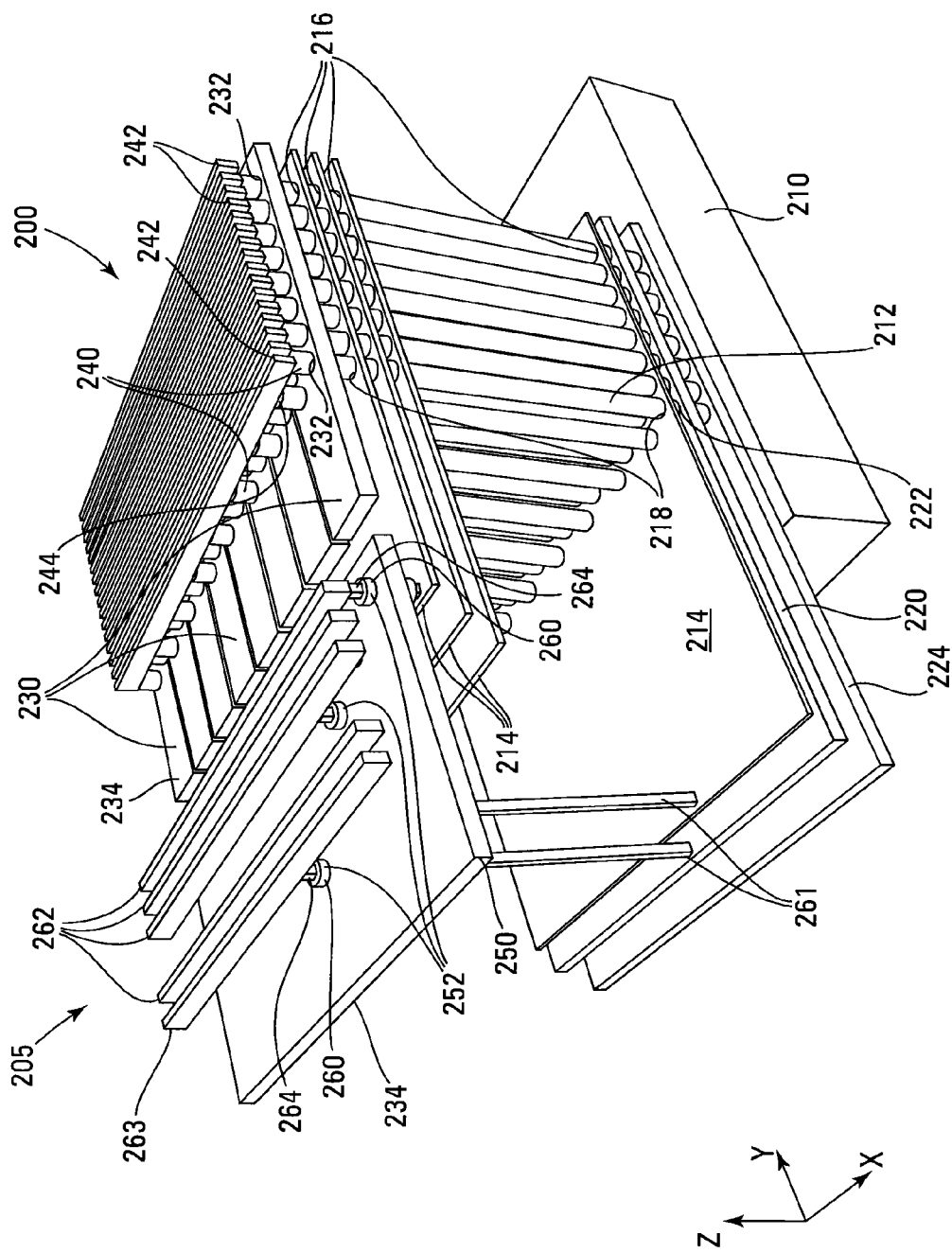
FIG. 2 illustrates a portion of a memory device, according to another embodiment.
Figure 3:
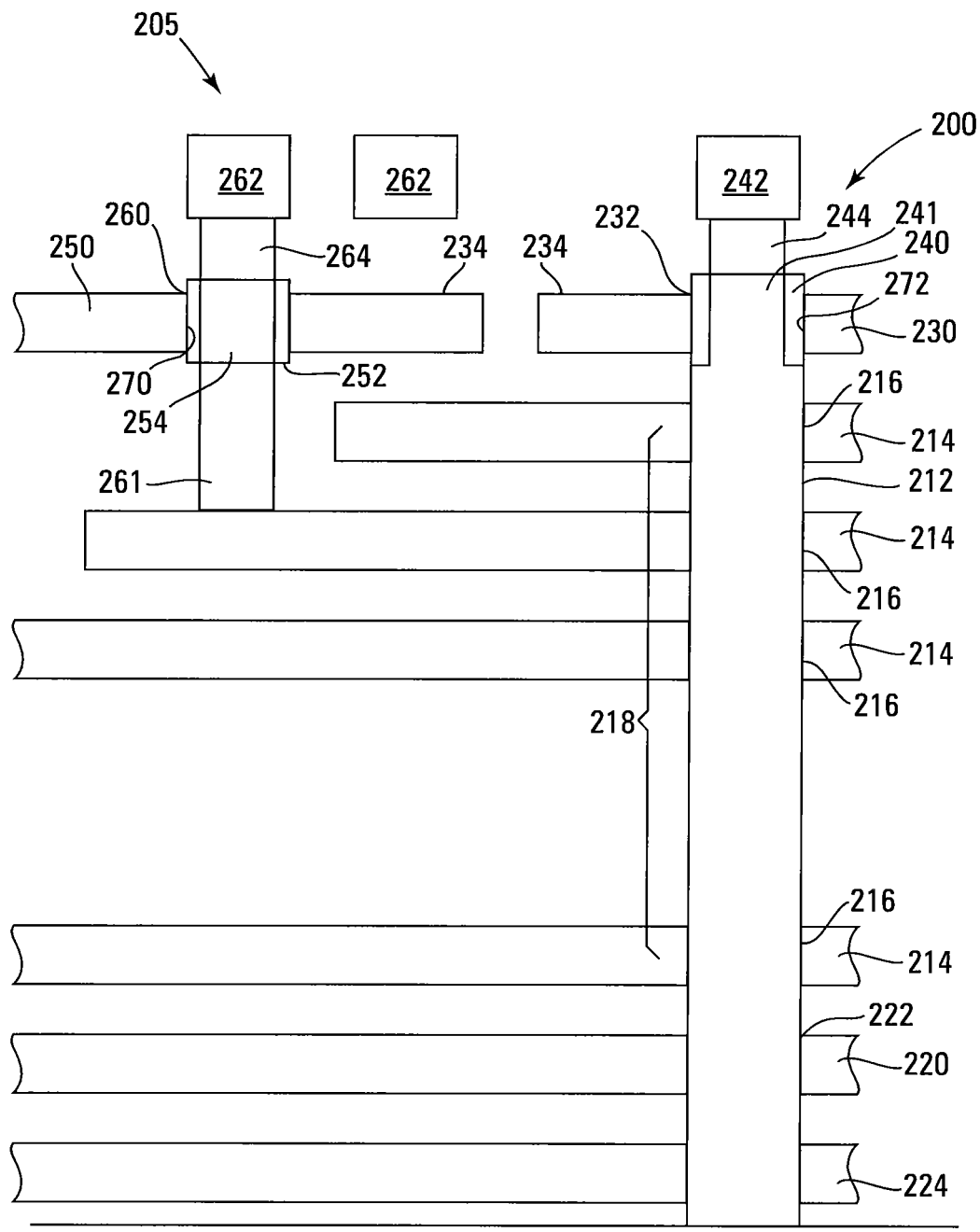
FIG. 3 illustrates a cross-section of a portion of a memory device, according to another embodiment.

FIG. 2 illustrates a portion of a memory device, such as memory device 100, that may include a portion of a stacked (e.g., three-dimensional) memory array 200 that may be a portion of memory array 104. Memory array 200 may be coupled to a periphery 205 that is adjacent (e.g., laterally adjacent) to memory array 200. Periphery 205 includes access circuitry for the memory array 200. Memory array 200 may be coupled to a periphery 210 that is adjacent to, e.g., that is vertically under, memory array 200. Periphery 205 may be three dimensional, in that it extends vertically in the z direction and horizontally in the x and y directions. FIG. 3 illustrates cross-sections of portions of memory array 200 and periphery 205, where cross-hatching is omitted for clarity.

Memory array 200 includes a plurality of substantially vertical structures 212 (e.g., vertical structures), such as pillars (e.g., columns). Each structure 212 might include a substantially vertical (e.g., a vertical) semiconductor (e.g., forming a core of the respective structure 212) and a charge-storage structure adjacent to (e.g., on) the semiconductor. For example, the semiconductor might be comprised of silicon that might be conductively doped to have a p-type conductivity or an n-type conductivity, and the charge storage structure might comprise a charge trap or a floating gate. Other structures capable of indicating a data state through changes in threshold voltage might also be used.

For some embodiments, access plates 214 might respectively intersect each structure 212 at different locations, e.g., at different vertical levels of each structure 212. For example, the access plates 214 might be respectively formed at different vertical levels within memory array 200 from conductors. The access plates 214 might be isolated and separated from each other, for example.

The intersection of an access plate 214 and a structure 212 may define a memory cell 216, such as a non-volatile memory cell. For example, a plurality of access plates 214 intersecting each structure 212 at different vertical levels might define a substantially vertical string (e.g., a vertical string) 218 of series-coupled memory cells 216, respectively at different vertical levels. Each memory cell 216 in a string 218 might be at substantially the same vertical level (e.g., the same vertical level) as the corresponding one of the access plates 214 that intersects that memory cell 216, for example. The details of the memory cells 216 are omitted from FIGS. 2 and 3 to better focus on the aspects of the disclosure.

During operation of one or more memory cells 216, such as a string 218 of memory cells 216, a channel can be formed in the semiconductor of the corresponding structure 212. The memory cells 216 at a common vertical level may be commonly coupled to the access plate 214 at that vertical level and may form a tier of memory cells, so that memory array 200 includes a vertical stack of tiers of memory cells. For example, the memory cells 216 of each string 218 are respectively in different tiers of memory cells. Note, for example, that each access plate 214 may be commonly coupled to or may form a portion of the control gate of the memory cells 216 of a tier of memory cells. That is, each access plate 214 may function as a common control gate of the memory cells 216 commonly coupled to that access plate 214, for example.

A select plate 220, such as a source select plate, e.g., formed from a conductor, might intersect structures 212 at a vertical level below the bottom tier of memory cells 216. For example, each intersection of select plate 220 and a structure 212 may define a select transistor 222, such as a source select transistor, so that a select transistor 222 is coupled to the bottom end of each string 218. For example, the select transistors 222 may be commonly coupled to select plate 220 and may form a tier of select transistors 222 at a vertical level below the bottom tier of memory cells 216.

Note that select plate 220 may form a common control gate of the select transistors 222. For example, select plate 220 might be coupled to or form a portion of the control gates of select transistors 222. Select plate 220 may be isolated and separated from access plates 214, for example. Select transistors 222 might be at substantially the same vertical level (e.g., the same vertical level) as select plate 220, for example. The details of the select transistors 222 are omitted from FIGS. 2 and 3 to better focus on the aspects of the disclosure.

For some embodiments, the portions of the structures 212 that intersect select plate 220 might not include the charge storage structure, but instead might include a dielectric, such as a gate dielectric, adjacent to (e.g., on) the semiconductor, e.g., between select plate 220 and the semiconductor. Note that during operation of a select transistor 222, a channel can be formed in the portion of the semiconductor at the intersection of the semiconductor the select plate 220.

A source, e.g., a source plate 224, might be commonly coupled to structures 212 at a vertical level below select plate 220, and thus the tier of select transistors 222. Note that each select transistor 222 may selectively couple a corresponding one of the strings 218 to source plate 224. Source plate 224 may be isolated and separated from access plates 214 and select plate 220, for example.

Each of a plurality of isolated, separated select plates 230, such as drain select plates, e.g., formed from a conductor 234, might intersect a plurality of pairs of structures 212 at a vertical level above the top tier of memory cells. For example, respective ones of the pairs of structures 212 of each of the plurality of pairs of structures 212 might be staggered (e.g., offset) with respect to each other, as shown in FIG. 2.

Each intersection of each of the plurality of select plates 230 and a structure 212 may define a local (e.g., an array) select device, e.g., select transistor 232, such as a drain select transistor, so that a select transistor 232 is coupled to the top end of each string 218. For example, a plurality of pairs select transistors 232 respectively coupled to plurality of pairs of structures 212 may be commonly coupled to a respective one of the plurality of isolated, separated select plates 230. Select transistors 232 may form a tier of select transistors 232 at a vertical level above the top tier of memory cells 216, for example. Select transistors 232 might be at substantially the same vertical level (e.g., the same vertical level) as select plates 230, for example.

For some embodiments, the portions of each of the plurality of pairs of structures 212 that intersect a respective one of the plurality of select plates 230 might not include the charge storage structure, but instead might include a dielectric 240, such as a gate dielectric, adjacent to (e.g., on) the semiconductor, such as a portion of semiconductor 241. For example, a dielectric 240 may be between semiconductor 241 and the corresponding select plate 230, as shown in FIG. 3. For some embodiments, semiconductor 241 might be formed independently of, e.g., after, the semiconductor in structure 212. Note that during operation of a select transistor 232, a channel can be formed in semiconductor 241 at the intersection of semiconductor 214 and the corresponding select plate 230.

A plurality of data lines 242 (e.g., bit lines) might be over the ends of structures 212. For example, data lines 242 might be coupled to the top ends of the semiconductors 241, e.g. either by direct contact or by a conductive contact 244 between the top ends of the semiconductors 241 and the data lines 242, as shown in FIG. 3. The data lines 242 might be substantially perpendicular to (e.g., perpendicular to) the select plates 230. Each select transistor 232 selectively couples a corresponding one of the strings 218 to a data line 242. For example, each of select transistors 232 provides selective access to a data line 242.

Note that a plurality of select transistors 232 may be commonly coupled to each of the data lines 242 so that the select transistors 232 commonly coupled to each of the data lines 242 are coupled to respective ones of the plurality of select plates 230. Also note that the select gates 232 coupled to successively adjacent data lines 242 may be staggered (e.g., offset) with respect to each other.

A pass-gate plate 250 may be in the periphery 205, as shown in FIGS. 2 and 3. For example, pass-gate plate 250 may be at substantially the same vertical level (e.g., at the same vertical level) as select plates 230. Pass-gate plate 250 and select plates 230 may be formed substantially concurrently (e.g., concurrently) during the same processing step from the same conductor, e.g., conductor 234.

A plurality of dielectrics 252, such as gate dielectrics, and a plurality of semiconductors 254 may pass through pass-gate plate 250 so that a dielectric 252 is between a semiconductor 254 and pass-gate plate 250, as shown in FIG. 3. For example, each intersection of a dielectric 252 and pass-gate plate 250 defines a global select device, such as a pass transistor 260, e.g., that might be a vertical pass transistor. For example, a vertical transistor may be defined as a transistor through which current passes substantially vertically (e.g., vertically) when the transistor is activated. Pass transistors 260 might be at substantially the same vertical level (e.g., the same vertical level) as pass-gate plate 250, for example.

Note that transistors 260 may be commonly coupled to pass-gate plate 250, where pass-gate plate 250 forms a common control gate for transistors 260. Transistors 260 form a tier of transistors 260 at a vertical level that is at substantially the same vertical level (e.g., is at the same vertical level) as select transistors 232.

Each of the access plates 214 may be coupled to a respective one of transistors 260 by a single contact 261, as shown in FIGS. 2 and 3. For example, each access plate 214 might be coupled to one semiconductor 254 by a single contact 261, as shown in FIG. 3 for one semiconductor 254. Note that transistors 260 might be at substantially the same vertical level (e.g., the same vertical level) as select transistors 232. For example, transistors 260 and select transistors 232 might be formed substantially concurrently (e.g., concurrently) during the same processing step.

Transistors 260 and select transistors 232 may have substantially the same structures (e.g. the same structures). For example, transistors 260 might have a dielectric 252 between a control gate, e.g., that is coupled to or is a portion of pass-gate plate 250, and a semiconductor 254, and select transistors 232 might have a dielectric 232 between a control gate, e.g., that is coupled to or is a portion of a select plate 230, and a semiconductor 241, as shown in FIG. 3.

Select plate 220 might be coupled to one of transistors 260 by a single contact 261, as shown in FIG. 2. For example, select plate 220 might be coupled to one semiconductor 254 by a single contact 261 in a manner similar to that shown in FIG. 3 for an access plate 214.

Global access lines 262 (e.g., global word lines) and a global select line 263 (e.g., a global source select line), might be over and respectively coupled to transistors 260 by contacts 264, as shown in FIGS. 2 and 3. For example, each of a plurality of global access lines 262 might be coupled to a respective one of transistors 260 by a single contact 264, and global select line 263 might be coupled to a respective one of transistors 260 by a single contact 264. For example, each global access line 262 might be coupled to one of semiconductors 254 by a single contact 264, and global select line 263 might be coupled to one of semiconductors 254 by a single contact 264.

Each global access line 262, that may be in turn coupled to an access-line driver (not shown), may be selectively coupled a respective one of the access plates 214 by one of the transistors 260 for some embodiments. Global select line 263, that may be in turn coupled to an select-line driver, such as a source-select-line driver (not shown), may be selectively coupled to select plate 220 by one of the transistors 260 for some embodiments.

Note that a transistor 260 may provide selective access to a global access line 262 or a global select line 263. For example, a transistor 260 might selectively couple the control gates of the memory cells 216 of a tier of memory cells, e.g., the control gates commonly coupled to an access plate 214, to a global access line 262, or a transistor 260 might selectively couple the control gates of the select transistors 222, e.g., the control gates commonly coupled to select plate 220, to global select line 263.

Note that contacts 264 might be at substantially the same vertical level (e.g., at the same vertical level) as contacts 244. For example, contacts 244 and contacts 264 might be formed substantially concurrently (e.g., concurrently) during the same processing step. Global access lines 262 and global select line 263 might be at substantially the same vertical level (e.g., the same vertical level) data lines 242. For example, global access lines 262, global select line 263, and data lines 242 might be formed substantially concurrently (e.g., concurrently) during the same processing step.

Access plates 214 might respectively extend to different distances, e.g., horizontal distances, from memory array 200 into periphery 205, as shown in FIG. 2. For example, access plates 214 might respectively terminate within periphery 205 at different distances, e.g., horizontal distances, from memory array 200, so that each contact 261 can pass directly from one of the transistors 260, e.g., without passing through (e.g., or contacting) any intervening access plates 214, to a portion of a respective one of the access plates 214 that extends beyond the intervening access plates 214, as shown in FIG. 2.

Select plate 220 may terminate within periphery 205 at a different (e.g., a greater) distance, e.g., horizontal distance, from memory array 200 than access plates 214, e.g., so that the corresponding contact 261 can pass directly from one of the transistors 260 to select plate 220 without passing through (e.g., or contacting) any intervening access plates 214. Note that the access plates 214 respectively terminate at lesser distances from memory array 200 as the vertical distance of the respective access plates from the bottom of memory array 200 increases.

Note that pass transistors, such as pass transistors 260, are sometimes located under a memory array, such as memory array 200, e.g., in periphery 210. However, such an arrangement leaves little room for additional pass transistors when the number of access plates is increased. In FIG. 2, the pass transistors are advantageously moved from periphery 210 to periphery 205 that is above the access plates. This can free up additional space in periphery 210 for critical circuitry that might need to be located under memory array 200.

The vertical orientation of the pass transistors 260 allows their channel lengths to be increased by increasing the thickness of pass-gate plate 250. For example, the channel lengths of pass transistors 260 might be substantially equal to the thickness of pass-gate plate 250. Therefore, the channel length of pass transistors 260 can be increased without increasing the horizontal surface area of pass-gate plate 250, and thus without substantially increasing the footprint of periphery 205 and thus the footprint of the memory device.

In an embodiment of fabrication, a vertical stack of conductors, respectively corresponding to source plate 224, select plate 220, and access plates 214, is formed so that the conductors corresponding to access plates 214 respectively extend into periphery 205 by different distances from memory array 200 and so that the conductor corresponding to select plate 220 extends into periphery 205 by different distance from memory array 200 than access plates 214. Dielectrics (not shown) may be formed between each of the conductors to form a vertical stack of alternating conductors and dielectrics. The structures 212, e.g., each including a semiconductor structure and a charge-storage structure, may then be formed in openings passing through vertical stack of alternating conductors and dielectrics to form the strings 218 of memory cells 216.

Openings for contacts 261, e.g., in dielectric (not shown), may then be formed, stopping at or in corresponding ones of the access plates 214. A conductor may then be formed in each of these openings to form those contacts 261 therefrom. An opening for a contact 261 may be formed stopping at or in select plate 220, and a conductor may then be formed in that opening to form that contact 261 therefrom.

Conductor 234 may then be formed over the vertical stack of alternating conductors and dielectrics, e.g., including the structures 212 and the contacts 261 for some embodiments, as shown in FIG. 3. Portions of conductor 234 may then be removed substantially concurrently (e.g., concurrently) to form the isolated, separated select plates 230 (FIG. 2) and the pass-gate plate 250 therefrom and to form openings 270 in pass-gate plate 250 and openings 272 in the isolated, separated select plates 230. For example, conductor 234 may be patterned, e.g., using a mask (e.g., of photo resist), to define the portions thereof that will be removed.

Dielectrics 240 and 252 may then be respectively formed in openings 272 and 270, e.g., substantially concurrently (e.g., concurrently). Semiconductors 241 and 254 may then be respectively formed, e.g., substantially concurrently (e.g., concurrently), in openings 272 and 270 respectively adjacent to dielectrics 240 and 252 so that semiconductors 254 are vertically above and in contact with respective ones of contacts 261. For example, semiconductors 254 may be vertically aligned with respective ones of contacts 261.

Contacts 244 and 264 may then be formed, e.g., substantially concurrently (e.g., concurrently) from conductors formed in openings, e.g., in a dielectric (not shown). For example, contacts 244 may be vertically above and in contact with respective ones of semiconductors 241, and contacts 264 may be vertically above and in contact with respective ones of semiconductors 254. For example, contacts 264 may be vertically aligned with respective ones of semiconductors 254, and contacts 244 may be vertically aligned with respective ones of semiconductors 241.

Data lines 242, global access lines 262, and global select line 263, may then be formed from a conductor, e.g., substantially concurrently (e.g., concurrently). For example, data lines 242 may be vertically above and in contact with contacts 244; global access lines 262 may be vertically above and in contact with respective ones of contacts 264; and global select line 263 may be vertically above and in contact with a respective one of contacts 264. For example, data lines 242, global access lines 262, and global select line 263 might be formed by patterning a conductor to designate portions of the conductor for removal and by subsequently removing the designated portions of the conductor.

Figure 4A:
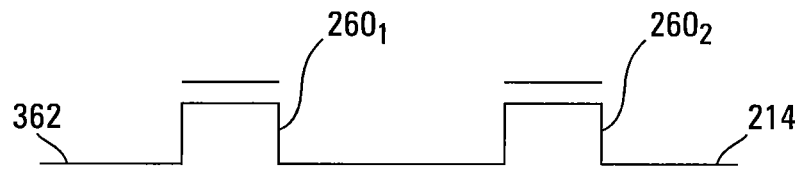
FIG. 4A is a schematic diagram of a configuration for reducing the source-to-gate-voltage stress on pass transistors, according to another embodiment.

FIG. 4A is a schematic diagram, illustrating a pair of series-coupled pass transistors $260_1$ and $260_2$ selectively coupling a global access line 362 to an access plate 214, e.g., for reducing the source-to-gate-voltage stress of each of pass transistors $260_1$ and $260_2$ compared to using a single pass transistor. When a single pass transistor, coupled between a global access line and an unselected access plate, is deactivated there can be a relatively large source-to-gate-voltage differential on the deactivated pass transistor, leading to an undesirable source-to-gate-voltage stress on the deactivated pass transistor. For example, the source of the deactivated pass transistor might be at about the global access line voltage, e.g., that may be at a program voltage (e.g., about 20V), and the control gate of the deactivated pass transistor might be at a relatively low voltage (e.g., about 0V) so that the pass transistor is deactivated, resulting in a source-to-gate-voltage differential of about 20V.

The pair of series-coupled pass transistors $260_1$ and $260_2$ coupled to an unselected access plate can reduce source-to-gate-voltage stress by activating pass transistor $260_1$, e.g., by applying an activation voltage (e.g., about 10V) to the control gate of pass transistor $260_1$ so that the source-to-gate-voltage differential on pass transistor $260_1$ is about 10V instead of about 20V for a single pass transistor. The activated pass transistor $260_1$ drops the voltage, e.g., to about 9V, on the source of pass transistor $260_2$, which is deactivated, e.g., by applying about zero volts to the control gate of pass transistor $260_2$, resulting in a source-to-gate-voltage differential on pass transistor $260_2$ of about 9V instead of 20V for a single pass transistor.

Figure 4B:
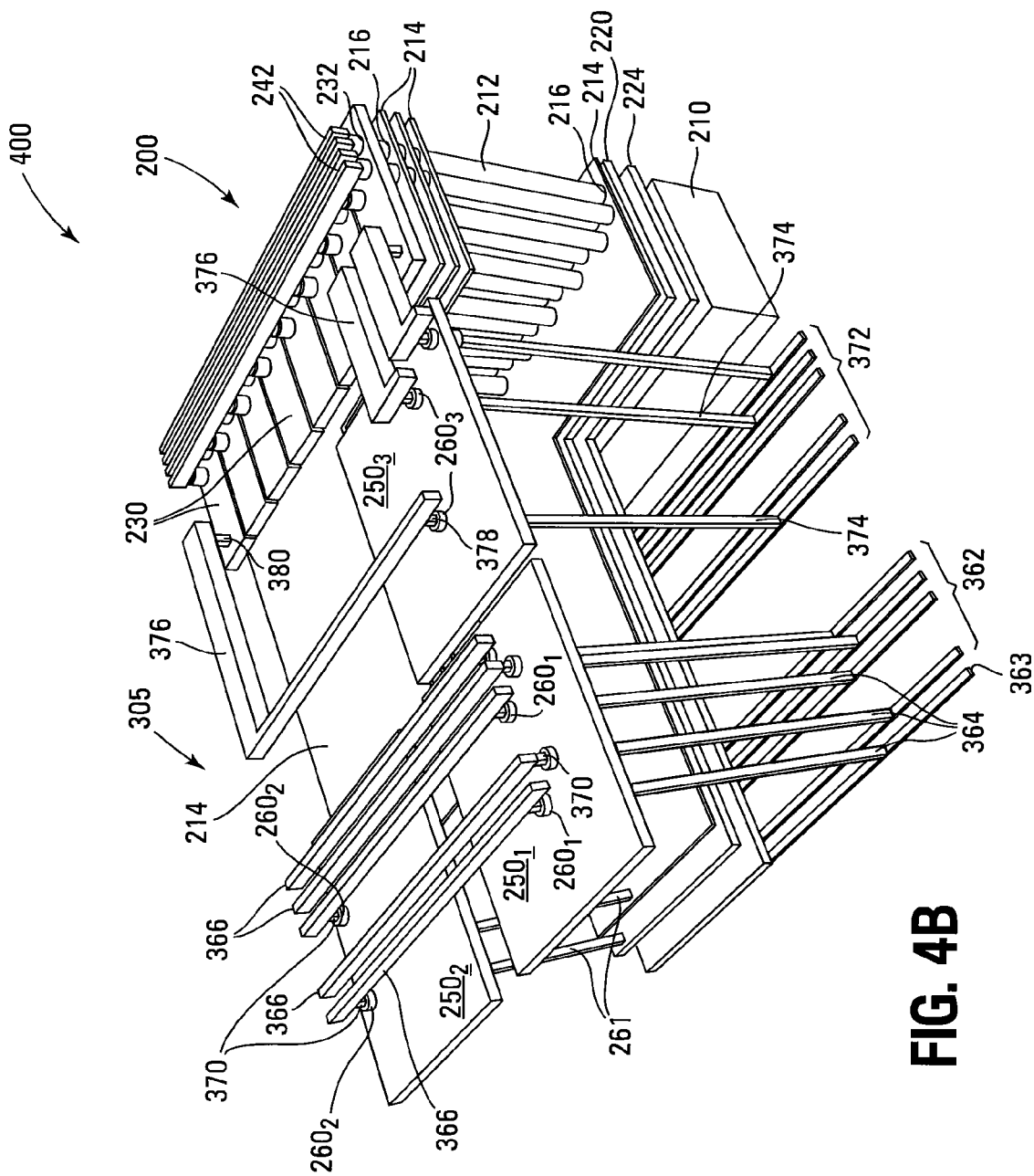
FIG. 4B is an illustration of a portion of a memory device that includes a physical implementation of the configuration of FIG. 4A, according to another embodiment.

The configuration in FIG. 4A can be difficult to implement in a periphery of a three-dimensional memory, e.g., owing to the added components (e.g., twice as many pass transistors). FIG. 4B is an illustration of a portion 400 of a memory device, such as memory device 100 in FIG. 1, that includes a portion of the memory array 200, that was described above in conjunction with FIGS. 2 and 3. The configuration in FIG. 4B facilitates the physical implementation of the configuration in FIG. 4A in a physical three-dimensional memory. Common numbering is used in FIG. 4B and FIGS. 2 and 3 to denote similar (e.g., the same components) in FIG. 4B and FIGS. 2 and 3, e.g., as described above in conjunction with FIGS. 2 and 3.

Memory array 200 may be coupled to a periphery 305 that is adjacent (e.g., laterally adjacent) to memory array 200 and to the periphery 210 under memory array 200. Periphery 305 includes pairs of the series-coupled pass transistors $260_1$ and $260_2$ respectively selectively coupling global access lines 362 to access plates 214, as shown schematically in FIG. 4A. A pair of series-coupled pass transistors $260_1$ and $260_2$ also couples a global select line 363 to select plate 220.

Pass transistors $260_1$ and $260_2$ may be similar to (e.g., the same as) as the pass transistors 260, e.g., as described above in conjunction with FIGS. 2 and 3. A plurality of pass transistors $260_1$ and a plurality of pass transistors $260_2$ are respectively commonly coupled to pass-gate plates $250_1$ and $250_2$ that are isolated and separated from each other. For example, pass-gate plate $250_1$ may be a common control gate for the plurality of pass transistors $260_1$, and pass-gate plate $250_2$ may a common control gate for the plurality of pass transistors $260_2$. For example, pass transistors $260_1$ and $260_2$ may be vertical transistors, e.g., having channel lengths respectively substantially equal to the thicknesses of pass-gate plates $250_1$ and $250_2$.

Global access lines 362 and global select line 363 may be located under periphery 305 at a vertical level below memory array 200, e.g., at a vertical level below source plate 224. Global access lines 362 may be coupled to access-line drivers, and global select line 363 may be coupled to a select-line driver, such as a source-select-line driver (not shown).

Each global access line 362 and the global select line 363 may be coupled to a pass transistor $260_1$ by a substantially vertical (e.g., a vertical) contact 364. Each pass transistor $260_1$ may be coupled in series with a respective one of the pass transistors $260_2$ by a line 366 (e.g., a connector) that might be substantially horizontal (e.g., horizontal). Pass transistors $260_1$ and $260_2$ may be coupled to a line 366 by contacts 370. Each access plate 214 may be coupled to one of the pass transistors $260_2$ by a contact 261, and select plate 220 may be coupled to one of the pass transistors $260_2$ by a contact 261.

A plurality of pass transistors $260_3$ may be commonly coupled to a pass-gate plate $250_3$ that may be a common control gate for the plurality of pass transistors $260_3$. Pass-gate plate $250_3$ may be isolated and separated from pass-gate plates $250_1$ and $250_2$, for example. Pass transistors $260_3$ may be similar to (e.g., the same as) as the pass transistors 260, e.g., as described above in conjunction with FIGS. 2 and 3. For example, pass transistors $260_3$ may be vertical transistors, e.g., having channel lengths substantially equal to the thickness of pass-gate plate $250_3$.

Each pass transistor $260_3$ may selectively couple a global select line 372 (e.g., a global drain select line) to a respective one of the select plates 230. Each global select line 372 might be coupled to select-plate driver, such as a drain-select-plate driver (not shown), so that each pass transistor $260_3$ might selectively couple a select-plate driver to a select plate 230.

Global select lines 372 may be located under periphery 305 at a vertical level below memory array 200, e.g., at substantially the same vertical level (e.g., the same vertical level) as global access lines 362. Each global select line 372 may be coupled to a pass transistor $260_3$ by a substantially vertical (e.g., a vertical) contact 374. Each pass transistor $260_3$ may be coupled to a respective one of the select plates 230 by a line 376 (e.g., a connector) that might be substantially horizontal (e.g., horizontal). A pass transistor $260_3$ may be coupled to a line 376 by a contact 378. Each line 376 may be coupled to a respective one of the select plates 230 by a contact 380.

Pass-gate plates $250_1$, $250_2$, and $250_3$ may be at substantially the same vertical level (e.g., at the same vertical level) as the select plates 230 and may be formed substantially concurrently with (e.g., concurrently with) the select plates 230, e.g., from the same conductor, as part of the same process step. The pass transistors $260_1$, $260_2$, and $260_3$ may be at substantially the same vertical level (e.g., the same vertical level) as the select transistors 232 and may be formed substantially concurrently with (e.g., concurrently with) the select transistors 232 as part of the same process step. Pass transistors $260_1$, $260_2$, and $260_3$ may also be at substantially the same vertical level (e.g., the same vertical level) as pass-gate plates $250_1$, $250_2$, and $250_3$.

Contacts 261, 364, and 374 may be formed substantially concurrently (e.g., concurrently) as part of the same process step. Contacts 370, 378, and 380 may be formed substantially concurrently with (e.g., concurrently with) contacts 244 (e.g., that couple select transistors 232 to data lines 242, as shown in FIG. 3) as part of the same processing step. Lines 366 and 376 may be at substantially the same vertical level (e.g., the same vertical level) as data lines 242 and may be formed substantially concurrently with (e.g., concurrently with) data lines 242, e.g., from the same conductor, as part of the same processing step.

Figure 5A:
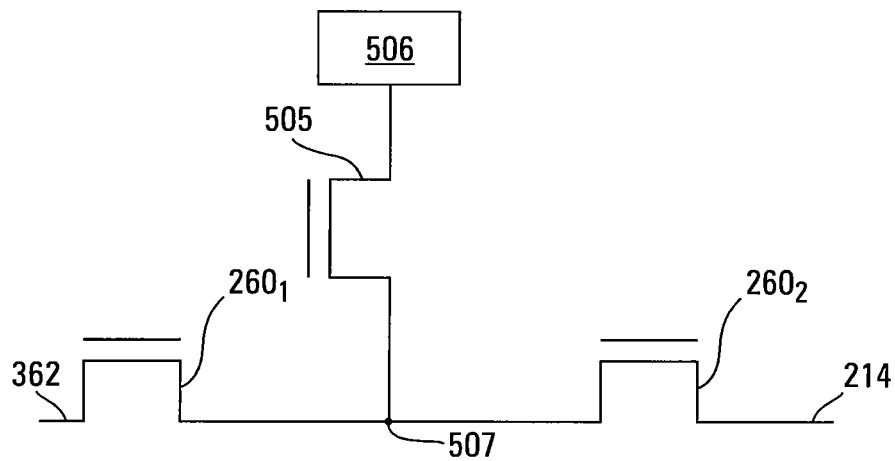
FIG. 5A is a schematic diagram of a configuration for reducing current leakage in a memory device, according to another embodiment.

FIG. 5A is a schematic diagram showing a transistor 505 selectively coupling a voltage source 506, e.g., that might be at Vcc, to a node 507 between and coupled to the pair of series coupled pass transistors $260_1$ and $260_2$. Common numbering is used in FIGS. 4A and 5A to denote similar (e.g., the same components), e.g., as described above in conjunction with FIG. 4A.

The configuration in FIG. 5A may facilitate advantages during erase operations. For example, during an erase, the access plates might be at an erase voltage (e.g., about 20V), and the global access lines might be grounded. When a single pass transistor or a pair of series-coupled pass transistors (FIG. 4B) are coupled between unselected access plates (e.g., at the erase voltage) and grounded global access lines during the erase, the pass gates are deactivated, by applying about 0V to their control gates. However, current can leak through the deactivated pass transistors from the access plates to the global access lines. The configuration in FIG. 5A acts to reduce (e.g., substantially stop) the current leakage. Note that the configuration in FIG. 5A might also be coupled between a global select line (e.g., global select line) and a select plate (e.g. a source select plate) for some embodiments.

The configuration in FIG. 5A can be difficult to physically implement in a periphery of a three-dimensional memory, owing to the added components (e.g., twice as many pass transistors and a transistor 505 for each access plate). The configuration in FIG. 5B facilitates the implementation of the configuration in FIG. 5A in a physical three-dimensional memory.

Figure 5B:
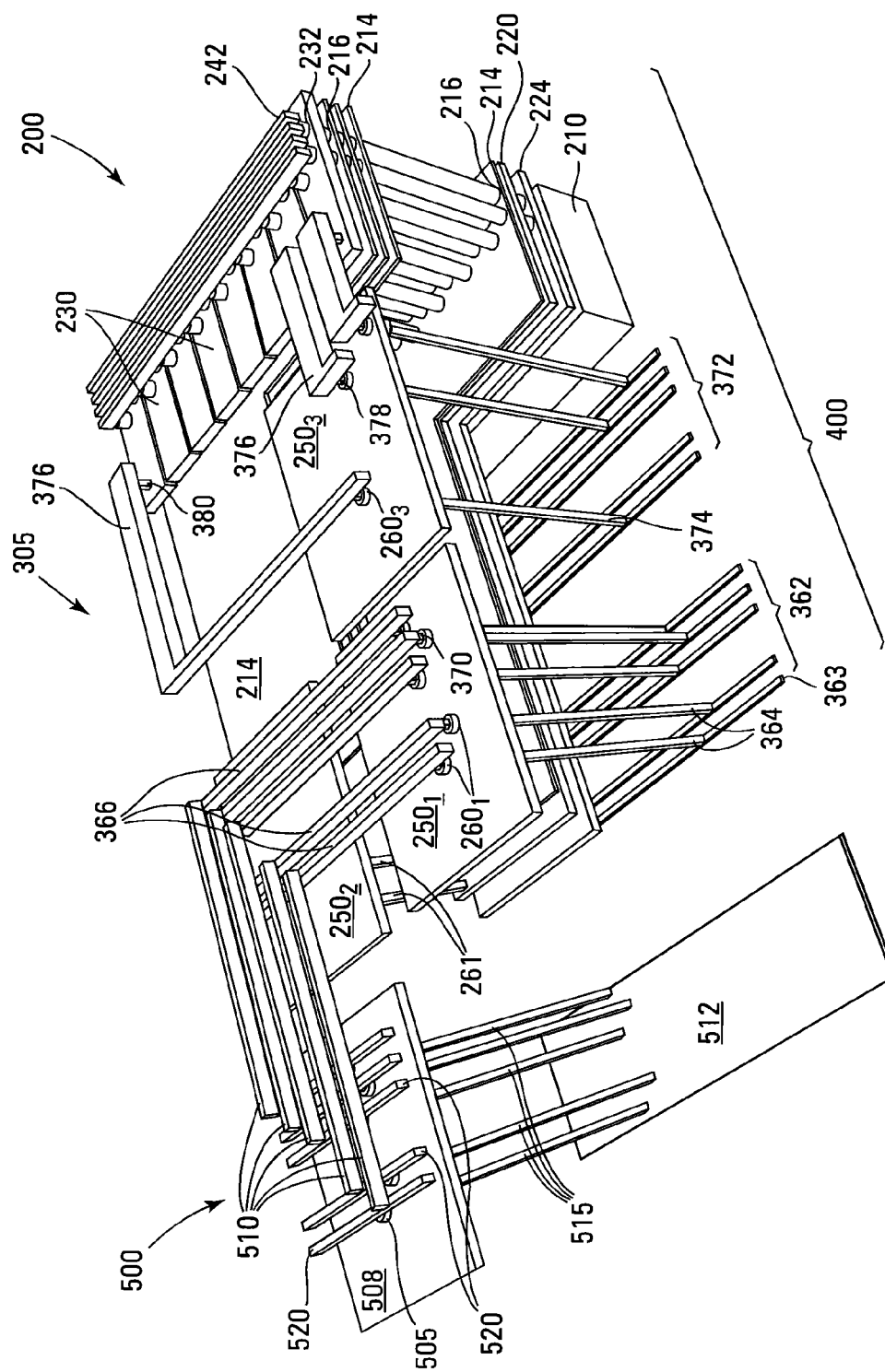
FIG. 5B is an illustration of a portion of a memory device that includes a physical implementation of the configuration of FIG. 5A, according to another embodiment.

FIG. 5B is a physical diagram of a portion of a memory device, such as memory device 100, that includes the portion 400 of FIG. 4B. Common numbering is used in FIG. 5B and FIGS. 2, 3, and 4B to denote similar (e.g., the same components), e.g., as described above in conjunction with FIGS. 2, 3, and 4B.

Circuitry 500 may be coupled to the portion 400 that may include periphery 305 and memory array 200, as shown in FIGS. 4B and 5B. Portion 400 may be as described above in conjunction with FIG. 4B. Periphery 305 may be as described above in conjunction with FIG. 4B, and memory array 200 may be as described above in conjunction with FIGS. 2, 3, and 4B.

Circuitry 500 may be coupled to lines 366, between the series coupled pass transistors $260_1$ and $260_2$ in periphery 305, by lines 510 (e.g., connectors). For example, each line 510 might be coupled to a line 366 by a contact. Circuitry 500 may include a plurality of transistors 505 commonly coupled to a control-gate plate 508 that is isolated and separated from pass-gate plates $250_1$, $250_2$, and $250_3$. For example, control-gate plate 508 may be a common control gate for the plurality of transistors 505. Transistors 505 may be similar to (e.g., the same as) as the pass transistors 260, e.g., as described above in conjunction with FIGS. 2 and 3, for some embodiments. For example, transistors 505 may be vertical transistors, e.g., having channel lengths substantially equal to the thickness of control-gate plate 508.

Each transistor 505 may be coupled to a voltage-supply plate 512 by a substantially vertical (e.g., a vertical) contact 515. Voltage-supply plate 512 may be coupled to a voltage source, such as voltage source 506 in FIG. 5A. Voltage-supply plate 512 may be under control-gate plate 508 and might be at a vertical level below memory array 200. For example, voltage-supply plate 512 might be at substantially the same vertical level (e.g., the same vertical level) as global access lines 362, global select line 363, and global select line 372. For some embodiments, voltage-supply plate 512 might be formed substantially concurrently with (e.g., concurrently with) global access lines 362, global select line 363, and global select line 372, e.g., from the same conductor, as part of the same processing step.

Each transistor 505 may be coupled to a respective one of lines 520, e.g., by a contact. Each of the lines 520 may be coupled to a respective one of the lines 510, e.g., by a contact. Note that lines 510 might be over (e.g., above) lines 520 and lines 366.

Contacts 515 might be formed substantially concurrently with (e.g., concurrently with) contacts 261, 364, and 374, e.g., as part of the same processing step. Pass-gate plates $250_1$, $250_2$, and $250_3$ and control-gate plate 508 may be at substantially the same vertical level (e.g., the same vertical level) as the select plates 230 and may be formed substantially concurrently with (e.g., concurrently with) the select plates 230, e.g., from the same conductor, as part of the same process step.

The pass transistors $260_1$, $260_2$, and $260_3$ and transistor 505 may be at substantially the same vertical level (e.g., the same vertical level) as the select transistors 232 and may be formed substantially concurrently with (e.g., concurrently with) the select transistors 232 as part of the same process step. Pass transistors 505 might be at substantially the same vertical level (e.g., the same vertical level) as control-gate plate 508.

Lines 366, 376, and 520 may be at substantially the same vertical level (e.g., the same vertical level) as data lines 242 and may be formed substantially concurrently with (e.g., concurrently with) data lines 242, e.g., from the same conductor, as part of the same processing step. The contacts that might couple transistors 505 to lines 520 may be formed substantially concurrently with (e.g., concurrently with) contacts 370, 378, and 380 and with contacts 244 (e.g., that couple select transistors 232 to data lines 242, as shown in FIG. 3) as part of the same processing step.

Figure 6A:
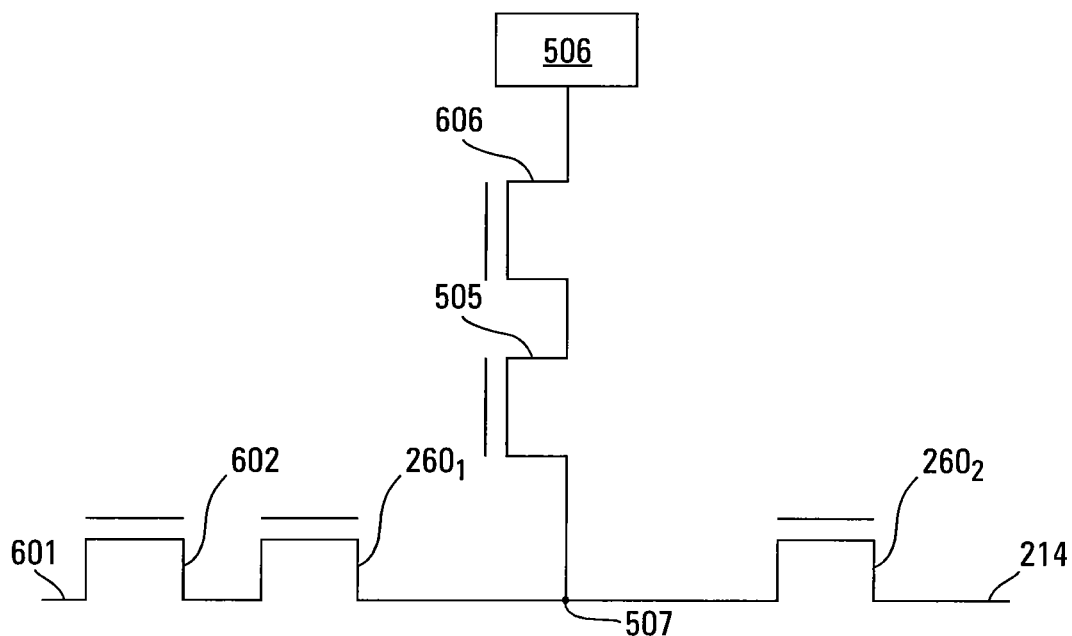
FIG. 6A is a schematic diagram of a configuration for reducing current leakage in a memory device, according to another embodiment.

FIG. 6A is a schematic diagram of a configuration for reducing (e.g., substantially stopping) current leakage from unselected access plates 214 to global access lines 601 during an erase. Common numbering is used in FIG. 6A and FIGS. 4A and 5A to denote similar (e.g., the same components), e.g., as described above in conjunction with FIGS. 4A and 5A.

The configuration of FIG. 6A might include series-coupled pass transistors 602, $260_1$, and $260_2$ between and coupled to an access plate 214 and a global access line 601. For example, pass transistor 602 might be between and coupled to global access line 601 and the pair of series coupled transistors $260_1$ and $260_2$. Series-coupled transistors 505 and 606 might selectively couple voltage source 506 to node 507 between and coupled to pass transistors $260_1$ and $260_2$. For example, transistor 606 might be between and coupled to transistor 505 and voltage source 506. Note that the configuration in FIG. 6A might also be coupled between a global select line (e.g., global select line) and a select plate (e.g. a source select plate) for some embodiments.

Figure 6B:
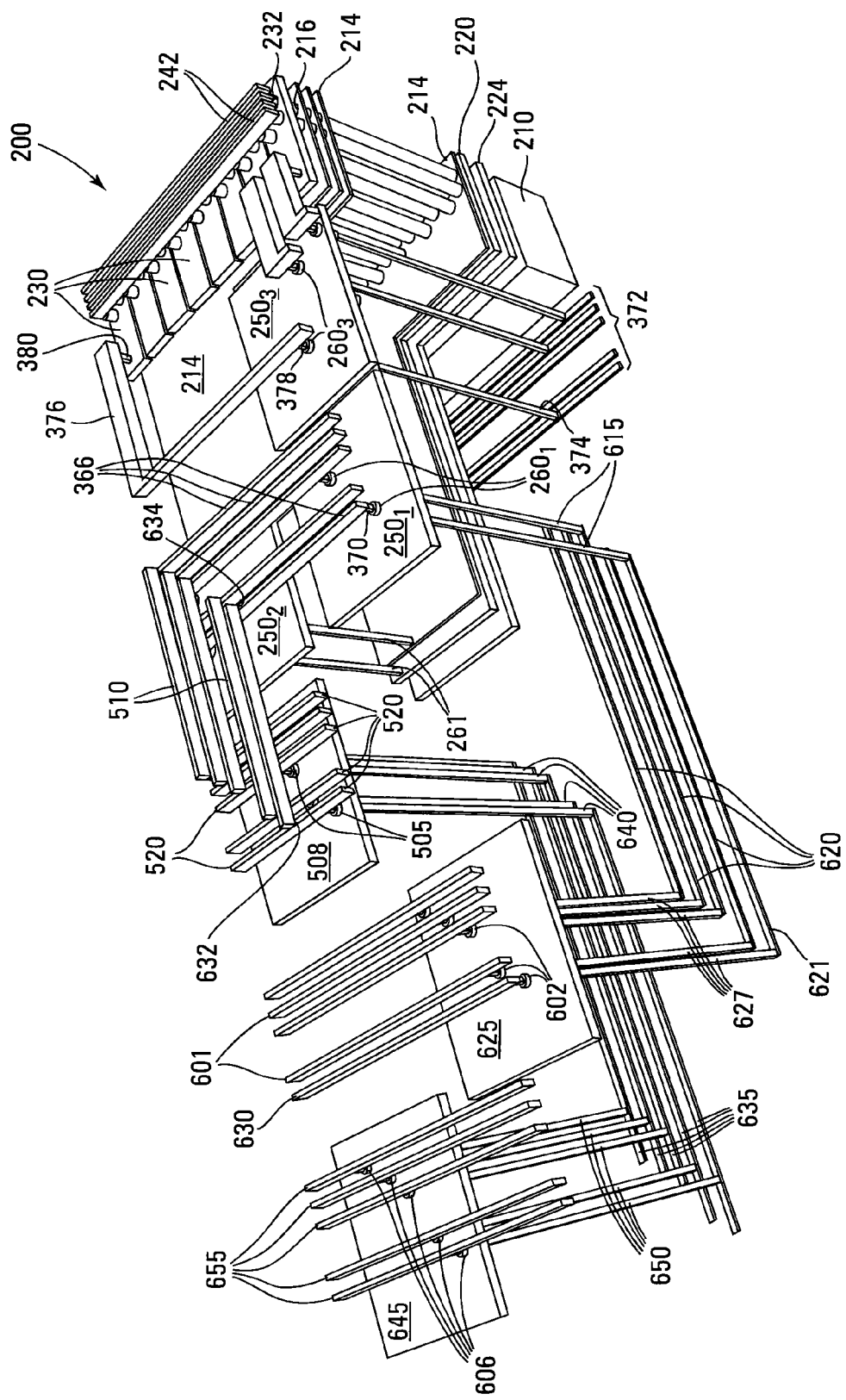
FIG. 6B is an illustration of a portion of a memory device that includes a physical implementation of the configuration of FIG. 6A, according to another embodiment.

The configuration in FIG. 6A can be difficult to physically implement in a periphery of a three-dimensional memory, owing to the added components. The configuration in FIG. 6B facilitates the implementation of the configuration in FIG. 6A in a physical three-dimensional memory. FIG. 6B is a physical diagram of a portion of a memory device, such as memory device 100, that may include the memory array 200 of FIGS. 2, 4B and 5B. Common numbering is used in FIG. 6B and FIGS. 2, 3, 4B, and 5B to denote similar (e.g., the same components), e.g., as described above in conjunction with FIGS. 2, 3, 4B, and 5B.

Each pass transistor $260_1$, commonly coupled to pass-gate plate $250_1$, may be coupled in series with a respective one of the pass transistors $260_2$, commonly coupled to pass-gate plate $250_2$, by a line 366 (e.g., a connector) that might be substantially horizontal (e.g., horizontal), as described above in conjunction with FIG. 4B. Pass transistors $260_1$ and $260_2$ may be coupled to a line 366 by contacts 370, e.g., to form pairs of series-coupled pass transistors $260_1$ and $260_2$, as described above in conjunction with FIG. 4B. Each access plate 214 may be coupled to a respective one of the pass transistors $260_2$ by a contact 261, and select plate 220 may be coupled to a respective one of the pass transistors $260_2$ by a contact 261, as described above in conjunction with FIG. 4B.

Pairs of the series-coupled pass transistors $260_1$ and $260_2$ may respectively selectively couple access plates 214 to routing lines 620. A pair of series-coupled pass transistors $260_1$ and $260_2$ may also couple select plate 220 to a routing line 621. For example, each routing line 620 might be coupled to a respective one of the pass transistors $260_1$, e.g., by one contact 615. Routing line 621 might also be coupled to a respective one of the one pass transistors $260_1$, e.g., by one contact 615.

Pass transistors 602 may be commonly coupled to a pass-gate plate 625 and may be at substantially the same vertical level (e.g., at the same vertical level) as pass-gate plate 625. For example, pass transistors 602 may be similar to (e.g., the same as) as the pass transistors 260, e.g., as described above in conjunction with FIGS. 2 and 3. For example, pass transistors 602 may be vertical transistors, e.g., having channel lengths substantially equal to the thickness of pass-gate plate 625.

Each routing line 620 might be coupled to a respective one of pass transistors 602 by one of contacts 627. Routing line 621 might also be coupled to a respective one of pass transistors 602 by one of contacts 627. Each of the plurality of global access lines 601 might be coupled to a respective one of the pass transistors 602, e.g., by a contact. Therefore, a pass transistor 602, a pass transistor $260_1$, and a pass transistor $260_2$ are coupled in series between global access lines 601 and one of the access plates 214, so that series-coupled pass transistors 602, $260_1$, and $260_2$ selectively couple a global access line 601, and thus an access-line driver (not shown) coupled to the global access line 601, to an assess plate 214.

A global select line 630 might be coupled to a respective one of the pass transistors 602, e.g., by a contact. Therefore, a pass transistor 602, a pass transistor $260_1$, and a pass transistor $260_2$ are coupled in series between global select line 630 select plate 220, so that series-coupled pass transistors 602, $260_1$, and $260_2$ selectively couple global select line 630, and thus a select-line driver, e.g., a source-select-line driver (not shown), coupled to global select line 630, to select plate 220.

Each transistor 505, commonly coupled to control-gate plate 508, may be coupled to a respective one of lines 520, e.g., by a contact. Each of the lines 520 may be coupled to a respective one of the lines 510, e.g., by a contact 632. Each of the lines 510 may be coupled to a respective one of lines 366, e.g., by a contact 634, at a location between pass transistors $260_1$ and $260_2$.

Each of transistors 505 might be coupled to a respective one of routing lines 635, e.g., by one of contacts 640. Each of transistors 606, e.g., commonly coupled to a control-gate plate 645, might be coupled to a respective one of routing lines 635, e.g., by one of contacts 650. For example, transistors 606 may be similar to (e.g., the same as) as the pass transistors 260, e.g., as described above in conjunction with FIGS. 2 and 3. For example, pass transistors 606 may be vertical transistors, e.g., having channel lengths substantially equal to the thickness of control-gate plate 645. Transistors 606 might be at substantially the same vertical level (e.g., at the same vertical level) as control-gate plate 645.

Each of transistors 606 might be coupled to a respective one of lines 655 (e.g., connectors). Each of the lines 655 might be coupled to voltage source 506 (FIG. 6A). Therefore, a transistor 606 and a transistor 505 are coupled in series between a line 655, and thus the voltage source coupled to the line 655, and a location on line 366, e.g., corresponding to node 507 (FIG. 6A), between pass transistors $260_1$ and $260_2$ that are coupled in series by the line 655.

Routing lines 620 and 635 might be located at a vertical below memory array 200, e.g., at substantially the same (e.g., the same) vertical level as global select lines 372. For example, routing lines 620 and 635 and global select lines 372 might be formed substantially concurrently (e.g., concurrently), e.g., from the same conductor, as part of the same processing step. Contacts 261, 615, 627, and 650 might be formed substantially concurrently with (e.g., concurrently with), e.g., as part of the same processing step.

Pass-gate plates $250_1$, $250_2$, and $250_3$, control-gate plate 508, pass-gate plate 625, and control-gate plate 645 may be at substantially the same vertical level (e.g., the same vertical level) as the select plates 230 and may be formed substantially concurrently with (e.g., concurrently with) the select plates 230, e.g., from the same conductor, as part of the same process step. The pass transistors $260_1$, $260_2$, and $260_3$, transistor 505, pass transistors 602, and transistors 606 may be at substantially the same vertical level (e.g., the same vertical level) as the select transistors 232 and may be formed substantially concurrently with (e.g., concurrently with) the select transistors 232 as part of the same process step.

Lines 366, 376, 520, and 655, global access lines 601, and global select line 630 may be at substantially the same vertical level (e.g., the same vertical level) as data lines 242 and may be formed substantially concurrently with (e.g., concurrently with) data lines 242, e.g., from the same conductor, as part of the same processing step.

Figure 7:
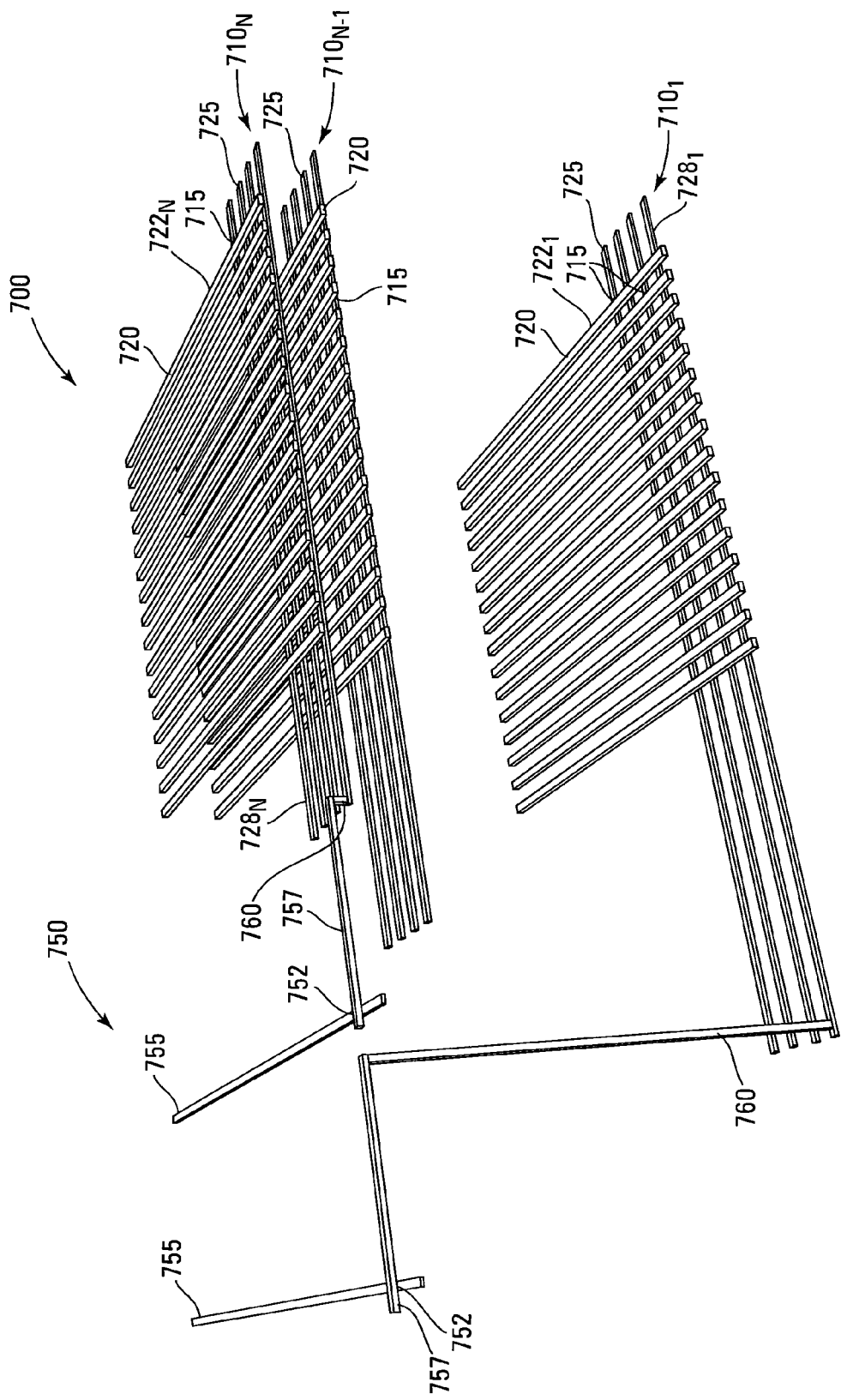
FIG. 7 illustrates a portion of a memory device, according to another embodiment.

FIG. 7 illustrates portion of a memory device, such as memory device 100, that may include a stacked memory array 700, such as a three-dimensional memory array. Memory array 700 may include a plurality of tiers 710 of memory cells 715 located at different vertical levels, e.g., a bottom tier $710_1$ to a top tier $710_N$. For example, tier $710_1$ to tier $710_N$ form a vertical stack of tiers of memory cells.

Each memory cell 715 might be a cross-point memory cell (e.g., a diode) formed at each crossing of a data line 720, such as a bit line, and a local access line 725, such as a local word line. For example each tier 710 of memory cells might be formed at the crossings of a respective one of a plurality of tiers $722_1$ to $722_N$ of data lines 720 and a respective one of a plurality of tiers $728_1$ to $728_N$ of local access lines 725. Note that each tier 722 of data lines 720 may include a plurality of data lines 720 at substantially the same (e.g., the same) vertical level, and each tier 728 of local access lines 725 may include a plurality of local access lines 725 at substantially the same (e.g., the same) vertical level.

Each memory cell 715 might be a local select device (e.g., an array select device) that provides selective access to a data line 720 at a respective crossing. Each memory cell 715 might include memory material between the data line 720 and the local access line 725 at each crossing. For example, a memory material might include one or more substances that undergo detectable change upon exposure to current, and may be, for example, a perovskite material, a chalcogenide material, an ionic transport material, a resistive switching material, a polymeric material and/or a phase change material.

A periphery 750 might be coupled to memory array 700. For example, periphery 750 might include a plurality of global select devices 752, such as diodes. Global select devices 752 may selectively couple global access lines 755, such as global word lines, in the periphery 750 to local access lines 725 one-to-one. For example, each global access line 755 might be selectively coupled to a respective one of local access lines 725, to which a plurality of memory cells 715 are commonly coupled, and might be coupled to an access-line driver, such as a word-line driver (not shown).

A global select device 752 might provide selective access to a global access line 755, for example. A routing line 757 might couple a global select device 752 to a substantially vertical (e.g. a vertical) contact 760 that couples the routing line 757, and thus the global select device 752, to a respective one of the local access lines 725.

Each global select device 752 may have substantially the same structure (e.g., the same structure as) a memory cell 715 for some embodiments. For example, each global select device 752 might be formed at a crossing of a global access line 755 and a routing line 757. That is, each pass transistor 752 might include memory material between the global access line 755 and the routing line 757 at each crossing, for example.

Global select devices 752 and the memory cells 715 in tier $710_N$ might be at substantially the same vertical level (e.g., the same vertical level) and might be formed substantially concurrently (e.g., concurrently) as part of the same processing step. For example, global select devices 752 might form a tier of global select devices 752 at substantially the same vertical level (e.g., the same vertical level) as tier $710_N$. The memory material between lines 757 and global access lines 755 might be formed substantially concurrently with (e.g., concurrently with) the memory material between the local access lines 725 and data lines 720 in tier $710_N$.

Global access lines 755 and the local access lines 725 in tier $710_N$ might be at substantially the same vertical level (e.g., the same vertical level) and might be formed substantially concurrently (e.g., concurrently) as part of the same processing step. Lines 757 and the data lines 720 in top tier $722_N$ of data lines 720 might be at substantially the same vertical level (e.g., the same vertical level) and might be formed substantially concurrently (e.g., concurrently) as part of the same processing step.

Conclusion

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device, comprising:
a stack of tiers of memory cells;
a tier of local devices at a level above the stack of tiers of memory cells; and
a tier of global devices at substantially a same level as the tier of local devices;
wherein a local device of the tier of local devices provides selective access to a data line;
wherein a global device of the tier of global devices provides selective access to a global access line; and
wherein a tier of memory cells of the stack of tiers of memory cells is configured to be selectively coupled to the global access line by the global device of the tier of global devices.

2. The memory device of claim 1, wherein the tier of local devices comprises a tier of memory cells.

3. The memory device of claim 2, wherein the tier of memory cells comprises a tier of cross-point memory cells.

4. The memory device of claim 2, wherein the memory cells comprise diodes and the global device comprises a diode.

5. The memory device of claim 2, wherein the memory cells comprise memory material and the global device comprises memory material.

6. The memory device of claim 1, wherein the local devices comprise select transistors and the global devices comprise pass transistors.

7. The memory device of claim 1, wherein the local devices and the global devices comprise substantially the same structures.

8. A memory device, comprising:
a plurality of stacked memory cells respectively at different vertical levels;
a select transistor above the plurality of stacked memory cells and configured to selectively couple the plurality of memory cells to a data line; and
a plurality of pass transistors at substantially the same vertical level as the select transistor, a pass transistor of the plurality of pass transistors being configured to selectively couple a control gate of a respective one of the memory cells to a corresponding global access line of a plurality of global access lines.

9. The memory device of claim 8, wherein each of the plurality of the pass transistors is a vertical pass transistor configured to pass current therethrough in a substantially vertical direction.

10. The memory device of claim 8, wherein the select transistor is a first select transistor, and further comprising:
a second select transistor below the plurality of stacked memory cells and configured to selectively couple the plurality of stacked memory cells to a source; and
another pass transistor at substantially the same vertical level as the first select transistor and configured to selectively couple the second select transistor to a global select line.

11. The memory device of claim 10, wherein the plurality of stacked memory cells comprises a string of series-coupled memory cells.

12. The memory device of claim 8, wherein the plurality of global access lines are above the plurality of pass transistors.

13. The memory device of claim 12, wherein the plurality of global access lines are at substantially the same vertical level as the data line.

14. The memory device of claim 8, wherein the plurality of pass transistors comprises a plurality of first pass transistors, and further comprising a second pass transistor at substantially the same vertical level as the select transistor and configured to selectively couple a global select line to the select transistor.

15. The memory device of claim 14, wherein the global access lines and the global select line are at substantially a same vertical level.

16. The memory device of claim 15, wherein the substantially the same vertical level of the global access lines and the global select line is selected from the group consisting of being above the select transistor and being below the plurality of stacked memory cells.

17. The memory device of claim 8, wherein the plurality of pass transistors comprises a plurality of first pass transistors, wherein each first pass transistor of the plurality of first pass transistors is coupled in series with a respective one of a plurality of second pass transistors to form a plurality of pairs of series-coupled first and second pass transistors, wherein each pair of series-coupled first and second pass transistors of the plurality of pairs of series-coupled first and second pass transistors is coupled between the control gate of one of the memory cells and the global access line corresponding to first pass transistor of that pair of series-coupled first and second pass transistors, wherein the plurality of second pass transistors are at substantially the same vertical level as the select transistor.

18. The memory device of claim 17, further comprising a plurality of third transistors at substantially the same vertical level as the select transistor, wherein each third transistor of the plurality of third transistors is configured to selectively couple a voltage source to a node between and coupled to the first and second pass transistors of a respective one of the pairs of series-coupled pairs of first and second pass transistors.

19. The memory device of claim 18, further comprising a fourth pass transistor of a plurality of fourth pass transistors coupled in series between each pair of series-coupled first and second pass transistors of the plurality of pairs of series-coupled first and second pass transistors and the global access line corresponding to that pair of series-coupled first and second pass transistors, wherein the plurality of fourth pass transistors are at substantially the same vertical level as the select transistor.

20. The memory device of claim 19, further comprising a fifth transistor of a plurality of fifth transistors coupled in series between each third transistor of the plurality of third transistors and the voltage source, wherein the plurality of fifth transistors are at substantially the same vertical level as the select transistor.

21. A memory device, comprising:
- a plurality of substantially vertical strings of series-coupled memory cells, the memory cells in each string of series-coupled memory cells of the plurality of substantially vertical strings of series-coupled memory cells respectively at different vertical levels;
- a plurality of access plates respectively at substantially the different vertical levels of the memory cells in each string of series-coupled memory cells of the plurality of substantially vertical strings of series-coupled memory cells, the memory cells at each of the different vertical levels commonly coupled to the access plate at substantially that vertical level;
- a plurality of select plates at a vertical level above a vertical level of a top access plate of the plurality of access plates;
- a plurality of data lines at a vertical level above the vertical level of the plurality of select plates;
- a plurality of select transistors commonly coupled to each of the data lines of the plurality of data lines so that the select transistors commonly coupled to each of the data lines of the plurality of data lines are coupled to respective ones of the plurality of select plates, wherein each of the plurality of select transistors commonly coupled to each of the data lines of the plurality of data lines is configured to selectively couple that data line to a respective one of the strings of series-coupled memory cells;
- a pass-gate plate at substantially the same vertical level as the plurality of select plates; and
- a plurality of vertical pass transistors passing through and commonly coupled to the pass-gate plate, each of the plurality of vertical pass transistors being configured to selectively couple a respective one of the access plates to a respective one of a plurality of global access lines;
- wherein the plurality of vertical pass transistors are at substantially the same vertical level as the pass-gate plate and the plurality of select transistors are at substantially the same vertical level as the plurality of select plates.

22. The memory device of claim 21, wherein the pass-gate plate is a first pass-gate plate and wherein the plurality of vertical pass transistors are a plurality of first vertical pass transistors, and further comprising:
- a second pass-gate plate at substantially the same vertical level as the plurality of select plates and isolated from the first pass-gate plate; and
- a plurality of second vertical pass transistors at substantially the same vertical level as the second pass-gate plate and commonly coupled to the second pass-gate plate;
- wherein each of the second vertical pass transistors of the plurality of second vertical pass transistors is configured to selectively couple a respective one of the plurality of select plates to a respective one of a plurality of global select lines.

23. The memory device of claim 21, wherein the pass-gate plate is a first pass-gate plate and wherein the plurality of vertical pass transistors are a plurality of first vertical pass transistors, and further comprising:
- a second pass-gate plate at substantially the same vertical level as the plurality of select plates and isolated from the first pass-gate plate; and
- a plurality of second vertical pass transistors at substantially the same vertical level as the second pass-gate plate and commonly coupled to the second pass-gate plate;
- wherein the second vertical pass transistors are coupled in series with respective ones of the first vertical pass transistors to form a plurality of pairs of series-coupled first and second vertical pass transistors; and
- wherein each of the plurality of pairs of series-coupled first and second vertical pass transistors is coupled between a respective one of the access plates and a respective one of the global access lines.

24. The memory device of claim 23, further comprising:
- a control-gate plate at substantially the same vertical level as the plurality of select plates and isolated from the first and second pass-gate plates; and
- a plurality of third vertical transistors at substantially the same vertical level as the control-gate plate and commonly coupled to the control-gate plate;
- wherein each of the plurality of third vertical transistors is configured to selectively couple a voltage source to a node between and coupled to the first and second vertical pass transistors of a respective one of the plurality of pairs of series-coupled first and second vertical pass transistors.

25. The memory device of claim 24, further comprising:
- a third pass-gate plate at substantially the same vertical level as the plurality of select plates and isolated from the first and second pass-gate plates and the control-gate plate; and
- a plurality of fourth vertical pass transistors at substantially the same vertical level as the third pass-gate plate and commonly coupled to the third pass-gate plate;
- wherein each of the plurality of fourth vertical pass transistors is between and coupled in series with a respective one of the plurality of global access lines and a respective one of the plurality of pairs of series-coupled first and second vertical pass transistors.

26. The memory device of claim 25, wherein the control-gate plate is a first control-gate plate, and further comprising:
- a second control-gate plate at substantially the same vertical level as the plurality of select plates and isolated from the first, second, and third pass-gate plates and the first control-gate plate; and
- a plurality of fifth vertical transistors at substantially the same vertical level as the second control-gate plate and commonly coupled to the second control-gate plate;
- wherein each of the plurality of fifth transistors is between and coupled in series with a respective one of the plurality of third vertical transistors and the voltage source.

27. The memory device of claim 21, wherein a channel length of each of the plurality of vertical pass transistors is substantially equal to a thickness of the pass-gate plate.

28. A method of forming a memory device, comprising:
- forming a stack of tiers of memory cells;
- forming a tier of local devices at a level above the stack of tiers of memory cells;
- forming a tier of global devices at substantially a same level as the tier of local devices substantially concurrently with forming the tier of local devices;
- wherein a local device of the tier of local devices provides selective access to a data line;
- wherein a global device of the tier of global devices provides selective access to a global access line; and wherein a tier of memory cells of the stack of tiers of memory cells is configured to be selectively coupled to the global access line by the global device of the tier of global devices.

29. The method of claim 28, wherein forming the tier of local devices comprises forming another tier of memory devices.

30. The method of claim 29, wherein each of the memory cells in each tier of memory cells is formed by forming memory material between a local access line and a data line, and wherein the global device of the tier of global devices is formed by forming memory material between the global access line and a routing line that couples the global device to a respective one of the tiers of memory cells.

31. The method of claim 28, wherein forming the tier of local devices comprises forming a tier of select transistors and forming the tier of global devices comprises forming a tier of pass transistors substantially concurrently with forming the tier of select transistors.

32. A method of forming a memory device, comprising:
forming a plurality of stacked memory cells respectively at different vertical levels;
forming a select transistor above the plurality of stacked memory cells, the select transistor configured to selectively couple the plurality of stacked memory cells to a data line; and
forming a plurality of pass transistors at substantially the same vertical level as the select transistor and substantially concurrently with forming the select transistor, a pass transistor of the plurality of pass transistors being configured to selectively couple a control gate of a respective one of the memory cells to a corresponding global access line of a plurality of global access lines.

33. The method of claim 32, wherein the plurality of pass transistors comprises a plurality of first pass transistors, and further comprising:
forming a plurality of second pass transistors substantially concurrently with forming the select transistor and at substantially the same vertical level as the select transistor;
wherein each first pass transistor of the plurality of first pass transistors is coupled in series with a respective one of the plurality of second pass transistors to form a plurality of pairs of series-coupled first and second pass transistors, wherein each pair of series-coupled first and second pass transistors of the plurality of pairs of series-coupled first and second pass transistors is coupled between one of the memory cells and the global access line corresponding to first pass transistor of that pair of series-coupled first and second pass transistors.

34. The method of claim 33, further comprising forming a plurality of third transistors at substantially the same vertical level as the select transistor and substantially concurrently with the select transistor, wherein each third transistor of the plurality of third transistors is configured to selectively couple a voltage source to a node between and coupled to the first and second pass transistors of a respective one of the pairs of series-coupled first and second pass transistors.

35. The method of claim 34, further comprising forming a plurality of fourth pass transistors at substantially the same vertical level as the select transistor and substantially concurrently with the select transistor, wherein each fourth pass transistor of the plurality of fourth pass transistors is coupled in series between each pair of series-coupled first and second pass transistors of the plurality of pairs of series-coupled first and second pass transistors and the global access line corresponding to that pair of series-coupled first and second pass transistors.

36. The memory device of claim 35, further comprising forming a plurality of fifth pass transistors at substantially the same vertical level as the select transistor and substantially concurrently with the select transistor, wherein each fifth transistor of the plurality of fifth transistors is coupled in series between each third transistor of the plurality of third transistors and the voltage source.

37. A method of forming a memory device, comprising:
forming a plurality of access plates;
forming a plurality of substantially vertical strings of series-coupled memory cells, the memory cells in each string of series-coupled memory cells of the plurality of substantially vertical strings of series-coupled memory cells respectively at different vertical levels, the access plates of the plurality of access plates respectively at substantially the different vertical levels of the memory cells in each string of series-coupled memory cells of the plurality of substantially vertical strings of series-coupled memory cells, the memory cells at each of the different vertical levels commonly coupled to the access plate at substantially that vertical level;
forming a plurality of select plates and a pass-gate plate substantially concurrently at a vertical level above a vertical level of a top access plate of the plurality of access plates;
forming a plurality of select transistors and a plurality of pass transistors substantially concurrently at substantially the vertical level of the plurality of select plates and the pass-gate plate; and
forming a plurality of data lines and a plurality of global access lines substantially concurrently at a vertical level above the vertical level of the plurality of select plates and the plurality of pass transistors;
wherein select transistors of the plurality of select transistors are commonly coupled to each of the data lines of the plurality of data lines;
wherein the select transistors of the plurality of select transistors that are commonly coupled to each of the data lines of the plurality of data lines are coupled to respective ones of the plurality of select plates;
wherein each of the plurality of select transistors commonly coupled to each of the data lines of the plurality of data lines is configured to selectively couple that data line to a respective one of the strings of series-coupled memory cells; and
wherein the plurality of pass transistors are commonly coupled to the pass-gate plate, each of the plurality of pass transistors being configured to selectively couple a respective one of the access plates to a respective one of the plurality of global access lines.

38. The method of claim 37, wherein the pass-gate plate is a first pass-gate plate and wherein the plurality of pass transistors are a plurality of first pass transistors, and further comprising:
forming a second pass-gate plate substantially concurrently with the plurality of select plates at substantially the same vertical level as the plurality of select plates;
forming a plurality of second pass transistors substantially concurrently with the plurality of select transistors at substantially the same vertical level as the second pass-gate plate so that the plurality of second pass transistors are commonly coupled to the second pass-gate plate; and
forming a plurality of global select lines;

wherein each of the second pass transistors of the plurality of second pass transistors is configured to selectively couple a respective one of the plurality of select plates to a respective one of the plurality of global select lines.

39. The method of claim 37, wherein the pass-gate plate is a first pass-gate plate and wherein the plurality of pass transistors are a plurality of first pass transistors, and further comprising:
    forming a second pass-gate plate substantially concurrently with the plurality of select plates at substantially the same vertical level as the plurality of select plates; and
    forming a plurality of second pass transistors substantially concurrently with the plurality of select transistors at substantially the same vertical level as the second pass-gate plate so that the plurality of second pass transistors are commonly coupled to the second pass-gate plate;
    wherein the second pass transistors are coupled in series with respective ones of the first pass transistors to form a plurality of pairs of series-coupled first and second pass transistors; and
    wherein each of the plurality of pairs of series-coupled first and second pass transistors is coupled between a respective one of the access plates and a respective one of the global access lines.

40. The method of claim 39, further comprising:
    forming a control-gate plate substantially concurrently with the plurality of select plates at substantially the same vertical level as the plurality of select plates; and
    forming a plurality of third transistors substantially concurrently with the plurality of select transistors at substantially the same vertical level as the control-gate plate and commonly coupled to the control-gate plate;
    wherein each of the plurality of third transistors is configured to selectively couple a voltage source to a node between and coupled to the first and second pass transistors of a respective one of the plurality of pairs of series-coupled first and second pass transistors.

41. The method of claim 40, further comprising:
    forming a third pass-gate plate substantially concurrently with the plurality of select plates at substantially the same vertical level as the plurality of select plates; and
    forming a plurality of fourth vertical pass transistors substantially concurrently with the plurality of select transistors at substantially the same vertical level as the third pass-gate plate and commonly coupled to the third pass-gate plate;
    wherein each of the plurality of fourth vertical pass transistors is between and coupled in series with a respective one of the plurality of global access lines and a respective one of the plurality of pairs of series-coupled first and second vertical pass transistors.

42. The method of claim 41, wherein the control-gate plate is a first control-gate plate, and further comprising:
    forming a second control-gate plate substantially concurrently with the plurality of select plates at substantially the same vertical level as the plurality of select plates; and
    forming a plurality of fifth vertical transistors substantially concurrently with the plurality of select transistors at substantially the same vertical level as the second control-gate plate and commonly coupled to the second control-gate plate;
    wherein each of the plurality of fifth transistors is between and coupled in series with a respective one of the plurality of third vertical transistors and the voltage source.

* * * * *